(12) United States Patent
Schoeppach et al.

(10) Patent No.: US 9,436,101 B2
(45) Date of Patent: Sep. 6, 2016

(54) OPTICAL ARRANGEMENT AND MICROLITHOGRAPHIC PROJECTION EXPOSURE APPARATUS INCLUDING SAME

(75) Inventors: Armin Schoeppach, Aalen (DE); Hans-Juergen Mann, Oberkochen (DE); Frank Eisert, Aalen (DE); Yim-Bun Patrick Kwan, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 682 days.

(21) Appl. No.: 13/407,466

(22) Filed: Feb. 28, 2012

(65) Prior Publication Data

US 2012/0182533 A1 Jul. 19, 2012

Related U.S. Application Data

(63) Continuation of application No. PCT/EP2010/064090, filed on Sep. 23, 2010.

(60) Provisional application No. 61/247,059, filed on Sep. 30, 2009.

(30) Foreign Application Priority Data

Sep. 30, 2009 (DE) .................. 10 2009 045 163

(51) Int. Cl.
| | | |
|---|---|---|
| *G03B 27/68* | (2006.01) | |
| *G03B 27/70* | (2006.01) | |
| *G03F 7/20* | (2006.01) | |
| *G02B 17/06* | (2006.01) | |

(52) U.S. Cl.
CPC ....... *G03F 7/70825* (2013.01); *G02B 17/0657* (2013.01)

(58) Field of Classification Search
CPC .......... G03F 7/70225; G03F 7/70233; G03F 7/70825; G03F 7/70833; G02B 17/0657
USPC ...... 355/52, 53, 55, 60, 66–71, 77; 359/871; 250/492.1, 492.2, 492.22, 493.1, 548
See application file for complete search history.

(56) References Cited

U.S. PATENT DOCUMENTS 4,733,945 A * 3/1988 Bacich ..................... 359/820
5,488,514 A * 1/1996 Bruning et al. ............. 359/811

(Continued)

FOREIGN PATENT DOCUMENTS

| DE | 100 62 786 | 6/2002 |
|---|---|---|
| DE | 10 2004 018 656 | 11/2005 |

(Continued)

OTHER PUBLICATIONS

The International Search Report and a Written Opinion from the counterpart PCT Application No. PCT/EP2010/064090, dated Jan. 28, 2011.

(Continued)

*Primary Examiner* — Christina Riddle
(74) *Attorney, Agent, or Firm* — Fish & Richardson P.C.

(57) ABSTRACT

An optical arrangement includes at least one optical element and a support element for the optical element. The optical element and the support element are connected together by way of at least three decoupling elements. The decoupling elements are formed monolithically with the optical element and with the support element.

27 Claims, 6 Drawing Sheets

(56) References Cited

U.S. PATENT DOCUMENTS

| | | | |
|---|---|---|---|
| 6,206,528 B1* | 3/2001 | Ray-Chaudhuri et al. | 359/871 |
| 6,229,657 B1* | 5/2001 | Holderer et al. | 359/822 |
| 6,426,790 B1* | 7/2002 | Hayashi | 355/72 |
| 6,700,715 B2 | 3/2004 | Sorg et al. | |
| 6,867,848 B2* | 3/2005 | Ebinuma et al. | 355/75 |
| 6,870,632 B2 | 3/2005 | Petasch et al. | |
| 7,116,399 B2 | 10/2006 | Box et al. | |
| 7,125,128 B2 | 10/2006 | Novak | |
| 7,345,834 B2 | 3/2008 | Murasato | |
| 7,529,046 B2 | 5/2009 | Schletterer et al. | |
| 7,602,564 B2 | 10/2009 | Torii et al. | |
| 8,044,373 B2 | 10/2011 | Butler | |
| 2001/0038446 A1* | 11/2001 | Takahashi | 355/67 |
| 2002/0011573 A1 | 1/2002 | Van Dijsseldonk et al. | |
| 2002/0085262 A1 | 7/2002 | Mumola et al. | |
| 2002/0176094 A1 | 11/2002 | Petasch et al. | |
| 2003/0234989 A1 | 12/2003 | Oshino et al. | |
| 2006/0262704 A1* | 11/2006 | Scherle et al. | 369/112.01 |
| 2007/0014037 A1 | 1/2007 | Frommeyer et al. | |
| 2007/0058269 A1 | 3/2007 | Mann et al. | |
| 2008/0212211 A1* | 9/2008 | Gellrich et al. | 359/819 |
| 2008/0218721 A1* | 9/2008 | Schoeppach et al. | 355/67 |
| 2008/0218883 A1* | 9/2008 | Torii et al. | 359/822 |
| 2008/0259469 A1 | 10/2008 | Arai | |
| 2009/0122288 A1* | 5/2009 | Sorg et al. | 355/53 |
| 2009/0122428 A1 | 5/2009 | Phillips et al. | |
| 2009/0207511 A1 | 8/2009 | Schoeppach et al. | |
| 2009/0219634 A1 | 9/2009 | Blanding et al. | |
| 2011/0165522 A1* | 7/2011 | Mann | G02B 17/0657 430/325 |

FOREIGN PATENT DOCUMENTS

| | | |
|---|---|---|
| JP | 2002-083767 | 3/2002 |
| JP | 2002-350699 | 12/2002 |
| JP | 2004-031491 | 1/2004 |
| JP | 2004-343116 | 12/2004 |
| JP | 2008-218710 | 9/2008 |
| JP | 2008-311647 | 12/2008 |
| JP | 2009-508344 | 2/2009 |
| TW | 2009 00877 A | 1/2009 |
| WO | WO 03/040785 | 5/2003 |
| WO | WO 2005/054953 | 6/2005 |
| WO | WO 2007/017089 A1 | 2/2007 |
| WO | WO 2007/031412 | 3/2007 |
| WO | WO 2009/110963 | 9/2009 |
| WO | WO 2010/028748 | 3/2010 |
| WO | WO 2011/029467 | 3/2011 |

OTHER PUBLICATIONS

Japanese Office Action, with translation thereof, for corresponding JP Appl No. 2012-531331, dated Apr. 1, 2014.

Japanese Office Action, with translation thereof, for corresponding JP Appl No. 2012-531331, dated Jul. 19, 2013.

Korean Office Action, with translation thereof, for corresponding KR Appl No. 10-2012-7011013, dated Jul. 28, 2014.

German Office Action, with translation thereof, for DE Appl No. 10 2009 045 163.3, dated Jun. 2, 2014.

Chinese Office Action, with translation thereof, for corresponding CN APp1 No. 201080052699.6, dated Jan. 26, 2014.

The International Preliminary Report on Patentability from the counterpart PCT Application No. PCT/EP2010/064090, dated Apr. 12, 2012.

German Office Action for corresponding DE Appl No. 10 2009 045 163.3, dated Apr. 20, 2010.

Taiwanese Office Action and Search Report, with translation thereof, for TW Appl No. 99133064, dated Jan. 5, 2015.

* cited by examiner a)

b)

c)

a)

b)

OPTICAL ARRANGEMENT AND MICROLITHOGRAPHIC PROJECTION EXPOSURE APPARATUS INCLUDING SAME

CROSS-REFERENCE TO RELATED APPLICATIONS

This application is a continuation of, and claims benefit under 35 USC 120 to, international application PCT/EP2010/064090, filed Sep. 23, 2010, which claims benefit under 35 USC 119 of German Application No. 10 2009 045 163.3, filed Sep. 30, 2009 and under 35 USC 119(e) of U.S. Ser. No. 61/247,059, filed Sep. 30, 2009. International application PCT/EP2010/064090 is hereby incorporated by reference in its entirety.

FIELD

The disclosure relates to an optical arrangement, as well as a microlithographic projection exposure apparatus including such an arrangement.

BACKGROUND

Microlithography is used for the production of microstructured components such as for example integrated circuits or LCDs. The microlithography process is carried out in what is referred to as a projection exposure apparatus having an illumination system and a projection objective. The image of a mask (=reticle) is illuminated via the illumination system, and is projected via the projection objective onto a substrate (for example a silicon wafer) which is coated with a light-sensitive layer (photoresist) and arranged in the image plane of the projection objective in order to transfer the mask structure on to the light-sensitive coating on the substrate.

Mirrors are used as optical components for the imaging process in projection objectives designed for the EUV range (wavelengths of for example about 13 nm or about 7 nm) due to the general lack of availability of suitable translucent refractive materials. Particularly in high-aperture projection objectives (for example with values of the numerical aperture of greater than 0.4), a small spacing (for example in the range of 20-50 mm) is present between the mirror arranged closest to the wafer and the wafer so that this mirror is comparatively thin (that is to say with low values for the ratio of thickness to diameter of for example 10 or more).

With thin mirrors of that kind, unwanted surface deformation phenomena can occur, for example due to the force of gravity or caused by mounting or coating effects. Mirror deformation phenomena caused by parasitic moments or forces or moments or forces which disturb static definiteness can be, for example, 50% of the surface deformation which is allowed for the mirrors in total.

Increased mirror dimensions, involved with increasing numerical apertures, to comply with the desired specifications, involve increasing natural frequencies to rigidly maintain the positions of the optical elements relative to each other even upon the occurrence of external vibration and to afford sufficient stiffness in relation to parasitic and mass-dependent moments or interference forces which are generally produced by screwing the mirrors after polishing.

For mirrors in positions other than the position that is last at the image plane side in the projection objective, when relatively large mirror diameters are involved, the attainable natural frequency is often limited independently of the mirror thickness. In particular for example natural frequencies which have been attained in an EUV projection objective equipped with six mirrors may not be adequate to sufficiently suppress interference influences due to external vibration to achieve the desired overlay specifications.

A large number of approaches using decoupling elements is known for resolving issues arising from mechanical stresses to optical elements such as mirrors or lenses.

It is known to provide decoupling elements in a kinematic three-point arrangement to achieve good reproducibility of the position by virtue of clearly defining the plane by three points.

WO 2005/054953 A2 discloses among other things a holding arrangement for an optical element in a projection objective. Between a holder and the optical element is a reinforcing element whose coefficient of thermal expansion substantially corresponds to that of the optical element.

US 2009/0122428 A1 discloses among other things optical elements of a projection exposure apparatus which are designed so that thermally induced deformation phenomena are reduced, for which purpose among other things a correction plate provided with a ribbed structure is also applied to the rear side of a mirror.

SUMMARY

The disclosure provides an optical arrangement in a microlithographic projection exposure apparatus, which even with higher numerical apertures reduces or avoids detrimental effects with respect to the imaging properties due to parasitic forces or moments occurring at the optical elements.

In accordance with an aspect of the disclosure an optical arrangement in a microlithographic projection exposure apparatus includes:
- at least one optical element; and
- a support element for the optical element;
  wherein the optical element and the support element are connected together by way of at least three decoupling elements; and
  wherein the decoupling elements are formed monolithically with the optical element and with the support element.

In accordance with a first aspect the disclosure is based on the concept of producing decoupling elements used for decoupling the optical element from the surrounding carrier structure monolithically, that is to say from one and the same block of material as the optical element or its optically effective surface (for example a glass material such as quartz glass ($SiO_2$), Zerodur®, ULE® or Clearceram®, that is to say applying the decoupling elements to the optical element precisely not in a separate joining step or using any connecting technology (for example using chemicals, adhesives, clamping connections etc). Consequently the shrinkage or stressing effects involved for example with adhesive connections and hardening thereof, as well as also instabilities in the connection under vacuum conditions, can be avoided.

The support element provides an interface between the optical element and a carrier structure of the projection exposure apparatus, wherein no stiffness is transmitted between the support element and the optical element, as a consequence of the three-point decoupling effect.

In accordance with the disclosure the potential increased complication and expenditure with respect to production technology, which is involved with a monolithic configuration for the decoupling elements, is deliberately accepted to reduce parasitic moments or forces and to take account the stiffness achieved in spite of large mirror diameters or small mirror thicknesses.

Thus in the arrangement according to the disclosure it is possible to provide a mirror that is sufficiently thin but nonetheless of sufficient stiffness. Joining technologies, such as, for example, adhesive and stress forces are unnecessary due to the monolithic configuration.

In accordance with the above aspect the decoupling elements are also formed monolithically with the support element so that no joining technologies also have to be applied between the decoupling elements and the support element and the application of stresses is also eliminated in that respect. The disclosure however is not limited to that configuration. Rather, the disclosure is also to be intended to embrace embodiments, in particular of a microlithographic projection exposure apparatus for EUV lithography, in which there is a monolithic configuration only between the optical element and the decoupling elements. Joining between the decoupling elements and the support element can be achieved via a separate joining technology.

In an embodiment the support element is connected to a carrier structure of the microlithographic projection exposure apparatus via mounting elements. The mounting elements are displaced in a peripheral direction with respect to the decoupling elements. Improved decoupling of the optical element (for example a mirror) from the carrier structure is achieved as a consequence of the displacement of the mounting elements forming the connection between the support element and the carrier structure, with respect to the decoupling elements providing the connection between the optical element and the support element.

In that way it is possible to achieve a further improvement in decoupling of parasitic holder influences insofar as the mounting elements or the coupling positions of the carrier structure are arranged at an increased or preferably maximum spacing from the joining locations or decoupling elements producing contact with the optical element. The maximum distance between the mechanical fixing to the carrier structure on the one hand and the decoupling elements or joining locations on the other hand affords a comparatively long or maximum travel distance and thus a relatively great suppression factor with respect to the transmission of any inevitable stresses from the mechanical connections between the carrier structure and the support element to the optical element.

That advantageous effect is also afforded if the connection between the optical element and the support element is not effected by monolithic decoupling elements, but by way of some other joining locations, for example when as described hereinafter the provision of decoupling elements which are monolithic (with the optical element) is not possible because of the mirror position.

Thus in a further aspect of the disclosure an optical arrangement of a microlithographic projection exposure apparatus includes:
- a carrier structure;
- at least one optical element; and
- a support element attached to the optical element at least three joining locations;
- wherein the support element is connected to the carrier structure by way of mounting elements;
- wherein the mounting elements are arranged displaced in a peripheral direction with respect to the joining locations; and
- wherein the optical element has a ratio of maximum diameter to maximum thickness of at least 10.

In an embodiment the decoupling elements or the joining locations are respectively arranged at a substantially constant spacing from each other in the peripheral direction. Moreover in an embodiment the mounting elements can be respectively arranged at a substantially constant spacing from each other in the peripheral direction relative to the decoupling elements or the joining locations. That makes it possible to achieve a maximum spacing between the coupling positions of the carrier structure from the joining locations or decoupling elements making a contact with the optical element.

In an embodiment of the foregoing approaches the decoupling elements or the joining locations are respectively displaced relative to each other in a peripheral direction through an angle of 120°±30°, such as 120°±20°, for example 120°±10°. In addition preferably the mounting elements are respectively displaced in a peripheral direction through an angle of 60°±20°, such as 60°±10°, for example 60°±3°, with respect to the decoupling elements or with respect to the joining locations.

In an embodiment the support element is connected to the optical element by way of precisely three decoupling elements or joining locations. Such a configuration is found to be particularly advantageous insofar as a further increase in the number of decoupling elements or joining locations does not lead necessarily to an improvement in the stiffness properties or the natural frequencies achieved, but the deformation phenomena can increase due to parasitic moments in a detrimental fashion.

In an embodiment the mounting elements are configured so that they provide a statically defined mounting for the optical element (in which respect there are in particular no superfluous forces for holding the optical element in its position). For that purpose three bipods can be provided for example as mounting elements in per se known manner. Alternatively there can also be any other mounting arrangement resulting in static location of the optical element, for example a hexapod mounting configuration.

In an embodiment the optical element and the support element are made from materials with mutually different coefficients of thermal expansion. In that way it is possible to take account of different rises in temperature of the optical element and the support element, as can occur in operation under EUV conditions.

In a further embodiment the optical element and the support element are made from the same material, in particular quartz glass ($SiO_2$), ULE®, Zerodur® or Clearceram®, whereby inter alia thermally induced deformation can be minimised.

In an embodiment the optical element is a mirror. The disclosure however is not restricted thereto. Rather, the term 'optical element' in the present application is basically used to embrace any optical elements, for example also refractive elements such as for example lenses or diffractive elements such as optical gratings.

In an embodiment the support element has at least one slot whereby (particularly with a tangential arrangement of a plurality of slots) additional flexibility is provided in the radial direction and at least partial decoupling in the radial direction can be implemented, which can be advantageous in particular in the case of temperature differences between the support element and the optical element or mirror.

In an embodiment the support element is arranged on an outside of the optical element, that is to say for example in the form of an outer ring with respect to the optical element.

In a further embodiment the support element can also be arranged on the surface of the optical element, facing away from an optically effective surface. That has the advantage that the support element can be produced with smaller outside dimensions (in the case of being in the form of a ring therefore for example with a smaller radius), whereby (glass) material is saved and weight is reduced. In addition in that way the support element can be provided with a higher degree of stiffness.

In an embodiment the optical element has a ratio of maximum diameter to maximum thickness of at least 5, in particular at least 10, in particular at least 15, further particularly at least 20, (wherein the diameter is respectively related to the surface which is optically used or acted upon by light). With such small thicknesses the disclosure is particularly advantageous insofar as the stiffness which can be achieved in accordance with the disclosure at small thicknesses is particularly useful.

In an embodiment the optical element has a central hole.

In an embodiment the optical element has measures for reducing the weight. In that case the edge portion can be increased for stiffening up the optical element in the direction of the optical axis of the system (that is to say in the direction of the thickness), whereby stiffness is not substantially reduced, with lower weight.

The disclosure further concerns a microlithographic projection exposure apparatus for EUV lithography including an illumination system and a projection objective, wherein the illumination system and/or the projection objective have an optical arrangement according to the disclosure having the above-described features. In an embodiment the optical element can be the mirror of the projection objective, such as the last optical element in the optical beam path.

In a further embodiment the optical element can be the mirror of the projection objective that is arranged most closely to the wafer. In addition the projection objective can have a numerical aperture of at least 0.3, in particular at least 0.4, in particular at least 0.45, further particularly at least 0.5. In that situation of use the disclosure is particularly advantageous insofar as—as discussed in the opening part of this specification—precisely in relation to comparatively high numerical apertures, in consideration of the desired small spacing between the mirror that is last at the image plane side and the wafer, the mirror is to be comparatively thin so that the stiffness which can be achieved in accordance with the disclosure with small thicknesses is particularly useful.

In addition the disclosure provides an optical arrangement in a microlithographic projection exposure apparatus including
  a carrier structure;
  at least one optical element which has a ratio of maximum diameter to maximum thickness of at least 10; and
  a support element for the optical element;
  wherein the support element is connected to the carrier structure by way of mounting elements; and
  wherein a natural frequency of the system of the optical element, the support element and mounting elements is at least 250 Hz.

The microlithographic projection exposure apparatus can be designed in particular for a working wavelength of less than 15 nm.

Further configurations of the disclosure are to be found in the description and the appendant claims.

BRIEF DESCRIPTION OF THE DRAWINGS

The disclosure is described in greater detail hereinafter via embodiments by way of example illustrated in the accompanying drawings, in which.

DETAILED DESCRIPTION OF PREFERRED EMBODIMENTS

Figure 1:
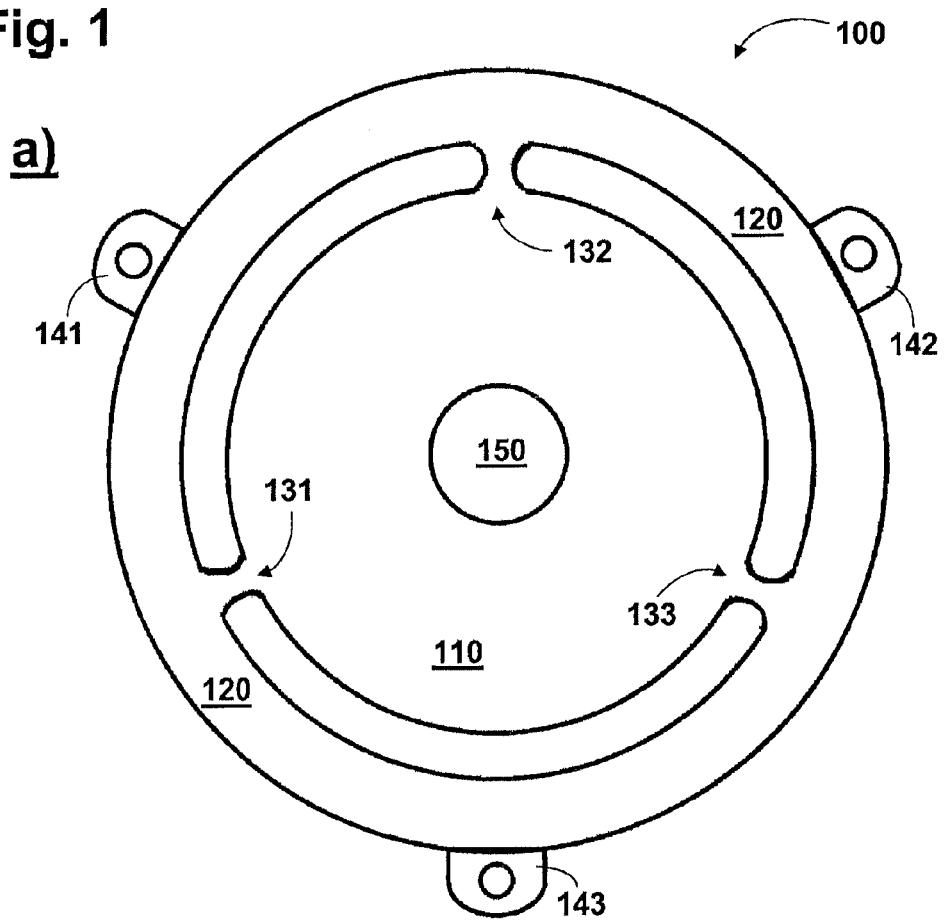
FIGS. 1a-b show diagrammatic views of an arrangement according to the disclosure in plan (FIG. 1a) and in section (FIG. 1b) in accordance with an embodiment.
FIG. 1c shows a diagrammatic plan view of a further embodiment of an arrangement according to the disclosure.
Figure 1:
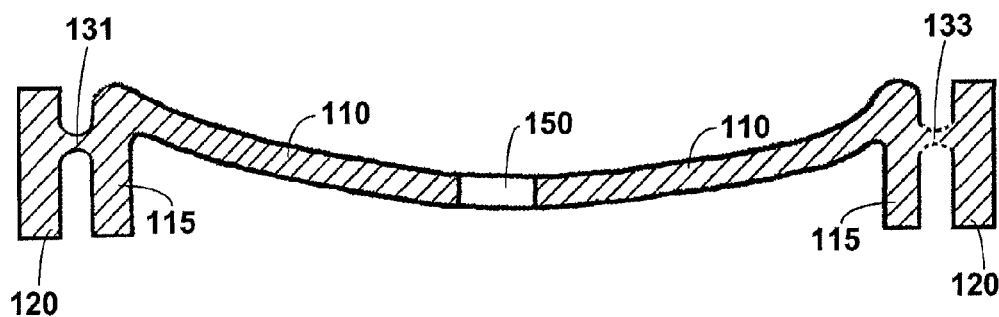
Figure 1:
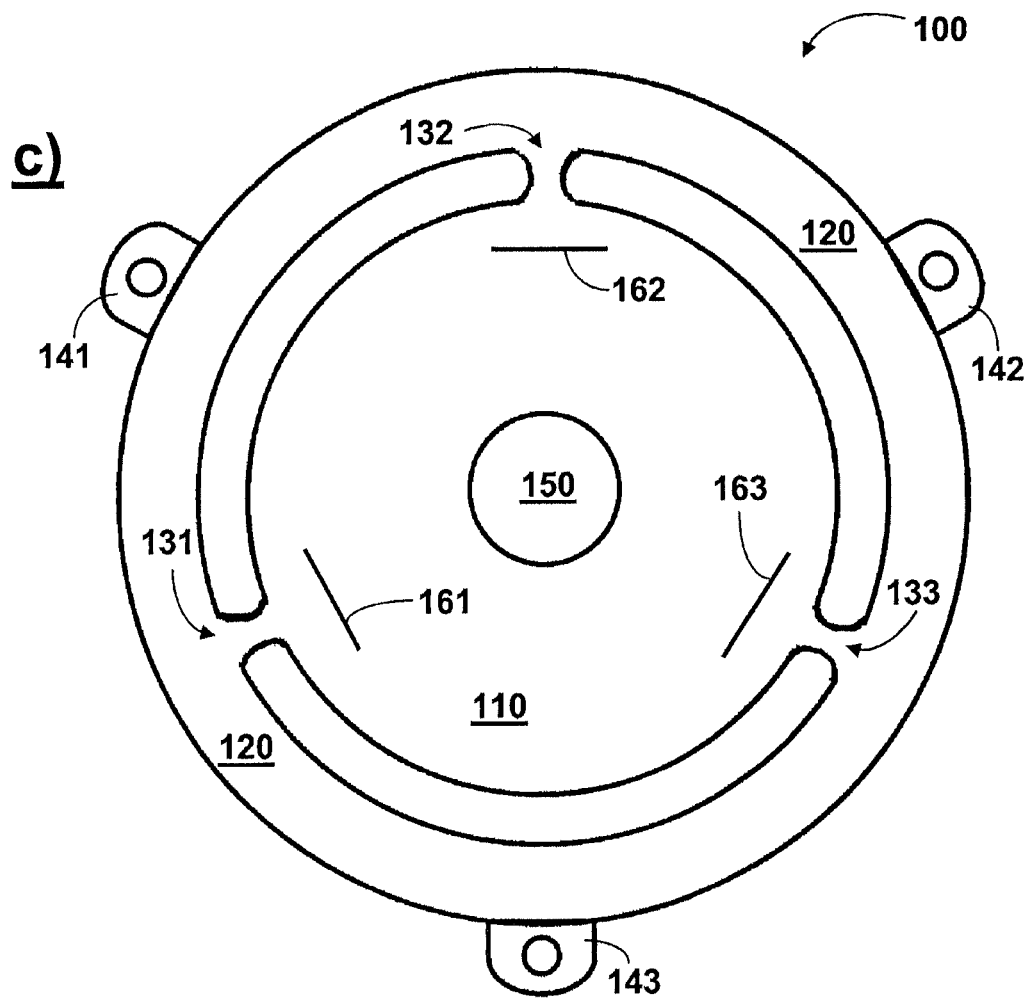

A first embodiment of the disclosure is further described with reference to FIGS. 1a-b.

Referring to FIGS. 1a-b an optical arrangement 100 according to a first embodiment includes an optical element 110 in the form of a mirror. The mirror can be in particular a mirror of a projection objective of a microlithographic projection exposure apparatus designed for EUV, which (without the disclosure being restricted thereto) is in the form of a concave mirror and as can be seen from FIG. 1b has inter alia a reinforced portion 115 for the purposes of stiffening up the mirror and a central hole 150.

The arrangement 100 further includes a support element 120 which in the embodiment of FIGS. 1a-b is in the form of an outer ring arranged concentrically with respect to the optical element 110. That support element 120 is connected to the optical element 110 by way of decoupling elements 131, 132 and 133 extending leg-like between the optical element 110 and the support element 120. In the specific embodiment moreover the above-mentioned reinforced portion 115 forms an (inner) ring arranged radially inwardly relative to the support element 120 or outer ring, wherein however that inner ring is at the same time part of the mirror itself.

Although the embodiment illustrated shows a substantially round mirror the disclosure is not restricted thereto. Rather the mirror in this embodiment as in the further embodiments can also be of any other for example elliptical, rectangular, reniform or triangular geometry.

The decoupling elements 131-133 are sufficiently soft or elastic so that no transmission of deformation from the support element 120 to the optical element 110 takes place. The dimensioning of those decoupling elements 131-133 is to be suitably selected depending on the specific aspects or dimensions of the optical element 110 and the support element 120, wherein for typical diameters for the mirror in the range of between 300 and 600 mm, the values by way of example with respect to the length and width of the leg-like decoupling elements 131-133 can be in the range of between 5 and 20 mm.

In addition the optical arrangement 100 has fixing attachments 141, 142 and 143 for mounting elements (not shown in FIG. 1) such as for example bipods, by way of which the arrangement 100 is coupled to a carrier structure (also not shown in FIG. 1) of the optical system. Coupling to the carrier structure can also be effected using decoupling elements in order to provide overall two-stage decoupling on the way from the optical element to the carrier structure, in conjunction with the decoupling elements 131-133.

A feature of the embodiment shown in FIGS. 1a-b is that the optical element 110, the support element 120 and the decoupling elements 131-133 are monolithic, that is to say produced in one piece or from one and the same block of material. A suitable material is for example quartz glass (SiO$_2$), ULE®, Zerodur® or Clearceram®.

As can be seen from FIG. 1*a* the decoupling elements 131, 132 and 133 are also respectively displaced in the peripheral direction through 120°. In addition the fixing projections 141, 142 and 143 which form connecting points in relation to the outer carrier structure are not only displaced in the peripheral direction also through 120° relative to each other, but also through 60° respectively in relation to the decoupling elements 131-133 which are respectively adjacent along the periphery so that as a result there is a maximum spacing under the given conditions as between each decoupling element 131-133 and the respective closest fixing projection 141-143.

The above-described relative arrangement can be implemented for example as shown in FIG. 1*a* in that the decoupling elements 131-133 are arranged for example at the positions of '12 o'clock', '4 o'clock' and '8 o'clock' whereas the fixing projections 141-143 for mechanical connection to the carrier structure or the remaining part of the optical system are arranged on the support element 120 at the positions '2 o'clock', '6 o'clock' and '10 o'clock'.

The arrangement including the optical element 110 or mirror, of the (monolithic) decoupling elements 131-133, the support element 120 or outer ring and the fixing projections 141, 142 and 143 with the mounting elements mounted thereto such as for example bipods can be viewed as a dynamic system 'M1-K1-M2-K2'. In that respect M1 denotes the mass of the optical element or mirror (in kg), K1 the stiffness of the decoupling elements 131-133 (in the main direction and in units of N/m), M2 the mass of the support element 120 or outer ring and K2 the stiffness of the mounting elements or bipods. For best possible decoupling of the mirror with respect to holder-induced parasitic influences K1 should be as small as possible in particular in the parasitic directions. In addition the natural frequency should be above 300 Hz. M1 and K1 are so dimensioned that they generate a natural frequency which is somewhat greater than the desired first natural frequency of the overall system (Hz) and can be for example in the range of between 350 Hz and 400 Hz. The 'inner ring' formed by the reinforced portion of the optical element, of the mass M2, should have adequate stiffness so that it behaves substantially like a rigid body, wherein the natural frequency generated by the total of the masses M1+M2 and K2 should be substantially greater than 300 Hz and for example be more than 600 Hz.

As indicated in FIG. 1*c* slots 161-163 can also be provided in the optical element 110 to provide additional flexibility or at least partial decoupling in a radial direction, which can be advantageous in particular in the case of temperature differences between the support element and the optical element or mirror. In the embodiment for example three slots 161-163 (of dimensions only by way of example of 20-40 mm in length) can be arranged or oriented tangentially. Alternately such slots can also be arranged in the support element 120 or ring.

Figure 2:
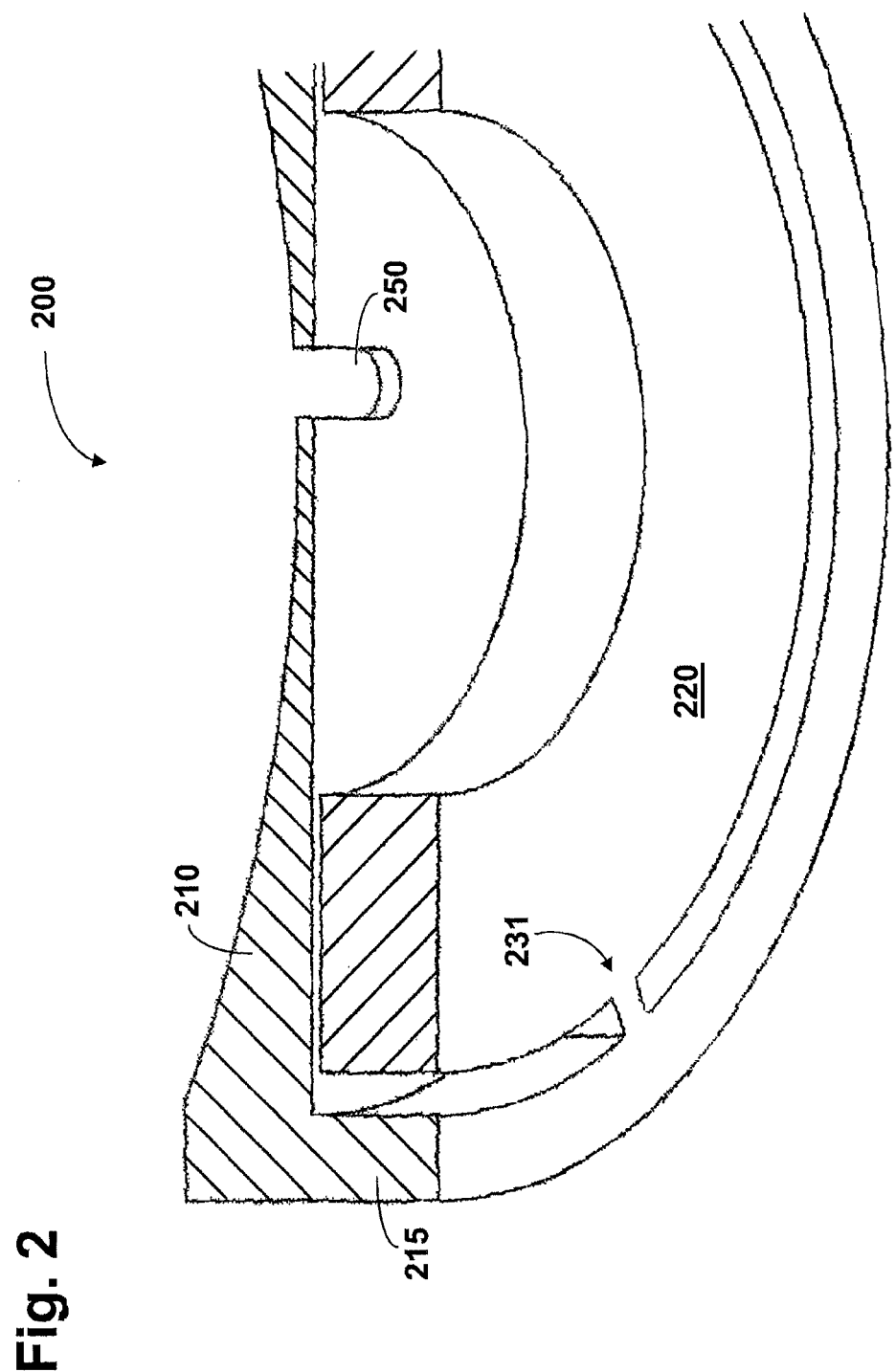
FIG. 2 shows a diagrammatic perspective view to illustrate a further embodiment of the disclosure.

FIG. 2 shows a further embodiment of an arrangement 200 according to the disclosure, wherein elements which are comparable to or are of substantially the same function as FIG. 1 are identified by references increased by '100'.

The embodiment of FIG. 2 substantially differs from that of FIG. 1 in that the support element 220 is not in the form of an outer ring with respect to the optical element 210 or mirror but is so-to-speak displaced radially inwardly, wherein the support element 220 is arranged on the rear side of the optical element 210 or mirror or on its side opposite to its optical active surface.

Accordingly in the FIG. 2 embodiment the three decoupling elements which form a connection between the support element 220 and the optical element 210 (and of which only one decoupling element 231 is shown in FIG. 2) are also arranged radially inwardly with respect to the optical element 210 or its reinforced edge portion 215, wherein the decoupling elements 231-233 extend from the support element 220 to the reinforced edge portion 215 of the optical element 210.

Similarly to the embodiment of FIGS. 1*a-b* the arrangement 200 of FIG. 2 also provides that the optical element 210 or the mirror, the support element 220 and the decoupling elements 231-233 are of a monolithic configuration with each other.

Although a monolithic configuration of the decoupling elements 131-133 and 231-233 is implemented both with the optical element and also with the support element in the embodiments of FIG. 1 and FIG. 2, further embodiments are possible and should be deemed to be embraced by the disclosure, in which the monolithic configuration occurs only with respect to the arrangement of the optical element and the decoupling elements, that is to say the connection between decoupling elements and support element is effected by way of a separate connecting procedure.

Figure 3:
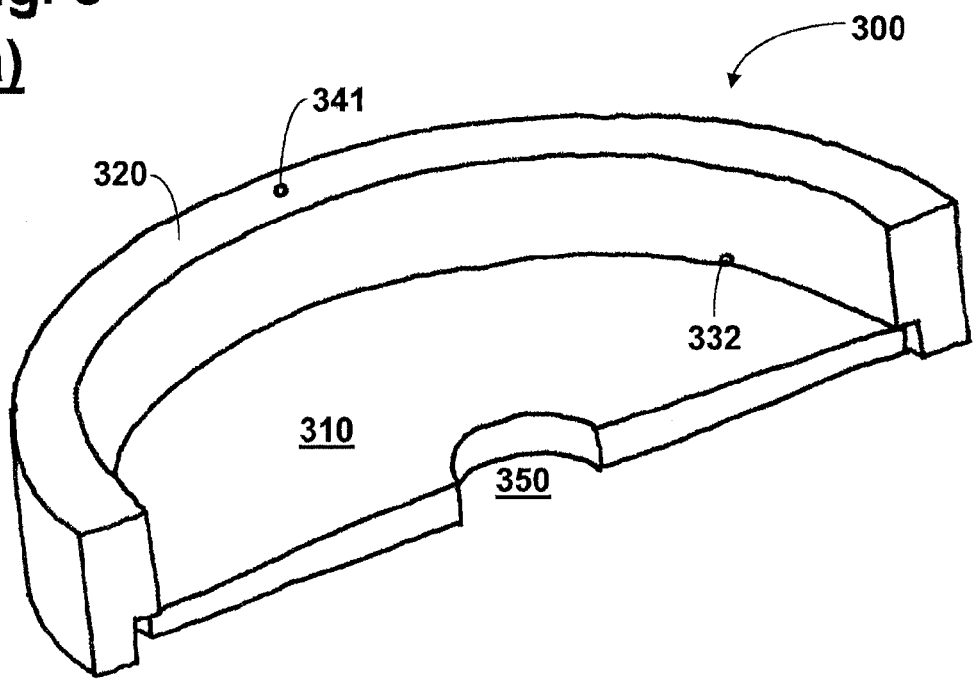
FIGS. 3a-b show diagrammatic perspective views to illustrate a further embodiment of the disclosure.
Figure 3:
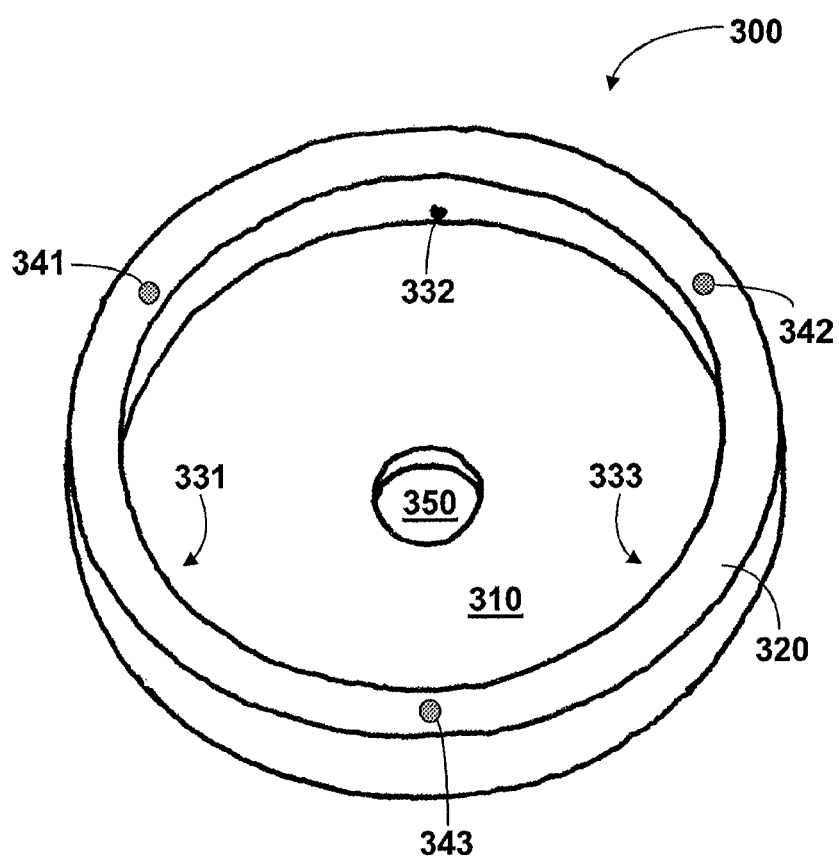

FIGS. 3*a-b* show a further embodiment of an arrangement 300 according to the disclosure, wherein elements which are comparable to or are of substantially the same function as FIG. 1 are identified by references increased by '200'.

The optical arrangement 300 in FIGS. 3*a-b* includes an optical element 310 again in the form of a mirror (here convex) which is attached to a support element 320 in the form of an outer ring for stiffening the optical element 310 or mirror at least three joining locations 331, 332, 333, wherein those joining locations 331, 332, 333, similarly to the arrangement of decoupling elements 131-133 in FIG. 1, are displaced in the peripheral direction relative to each other through 120° respectively.

Unlike the FIG. 1 embodiment however the connection at the joining locations 331-333 is not effected by way of monolithic decoupling elements but using a suitable connecting or joining procedure, for example by laser soldering or in the form of an adhesive join. Dimensions purely by way of example of the joining locations can be of the order of magnitude (without the disclosure being restricted thereto) in the range of 5 mm*5 mm, as with the here substantially flat connection and the flexural stresses which accordingly are lower in comparison with the embodiments of FIGS. 1 and 2, such small cross-sectional areas are already adequate.

The configuration of FIGS. 3*a-b* is particularly suitable for mounting the mirror in the projection objective, that is last at the image plane side or is arranged immediately in front of the wafer, as from the aspect of production engineering treating or polishing that mirror would be very complicated and expensive in the case involving the presence of monolithic decoupling elements, similarly to the embodiments of FIG. 1 or FIG. 2.

Also similarly to the embodiment of FIG. 1 connecting points 341, 342 and 343 are also displaced in the peripheral direction on the one hand through 120° relative to each other, in relation to mounting elements (not shown in FIG. 3) such as for example bipods, by way of which the arrangement 300 is coupled to a carrier structure (also not shown in FIGS. 3*a-b*) of the optical system, and on the other hand are also displaced in the peripheral direction through 60° respectively with respect to the joining locations 331, 332, 333 which are respectively adjacent along the periphery so that as a result this provides a maximum spacing, under the given conditions, between each joining location 331, 332, 333 and the respectively most closely adjacent connecting point 341-343 or mounting element.

Figure 4:
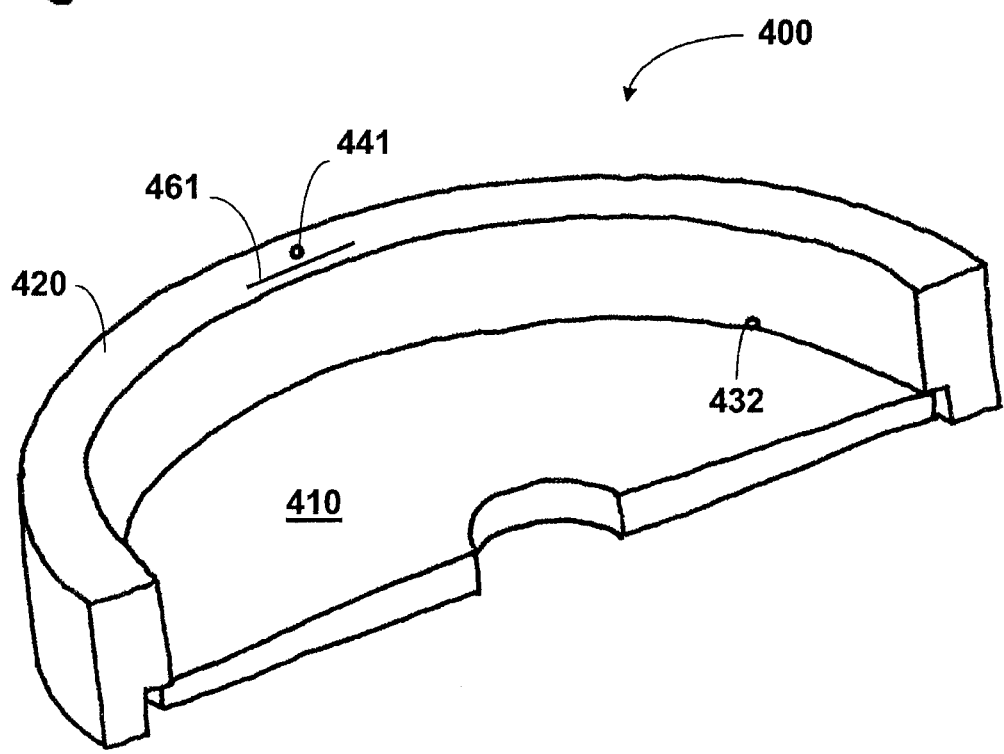
FIG. 4 shows a diagrammatic detail view to illustrate a further embodiment of the disclosure.

As indicated in FIG. 4 slots 461, . . . can also be provided in the support element 420 or ring, to achieve a decoupling effect, in order for example to take account of a different rise in temperature which is possible in operation under EUV conditions with respect to the mirror on the one hand and the support element or ring on the other hand. In particular three slots 461-463 (with dimensions only by way of example of 20-40 mm in length) can be arranged or oriented tangentially, in which case their behaviour is similar to the triple bipod and it is possible to provide sufficient kinematic stiffness in the mirror plane.

For two actual embodiments by way of example of an optical arrangement, Table 1 shows characteristic values for two different mirror dimensions (Example No 1: maximum mirror thickness or height t=17.5 mm; Example No 2: maximum mirror thickness or height t=25 mm), wherein the dimensions of the ring forming the support element 320, with a ring width (that is to say difference between outside and inside diameter) a=30 mm and a ring height of h=60 mm, as well as the material (quartz glass, $SiO_2$) were selected to be the same.

As can be seen from Table 1, both for Example No 1 and also for Example No 2, values for the first natural frequency (for the system consisting of mirror, support element or ring and a bipod set forming the basis for the arrangement by way of example) near to 400 Hz and mass values (for the arrangement consisting of the mirror and support element or ring) markedly below 10 kg are achieved, in which respect in addition for Example No 2 the deformation caused by gravity involves values below 500 nm. Table 1 also indicates some of the Zernike coefficients resulting upon development of the deformation acquired in Zernike polynomials, both for radial and also tangential moments, in which respect without exception as desired values below less than 0.5 nm are achieved and wherein the mirror in accordance with Example No 2, involving the greater thickness, has scarcely still any deformation phenomena. The parasitic moments also come from a bipod set which by way of example forms the basis of the configuration, with the usual mounting and production tolerances.

Figure 5:
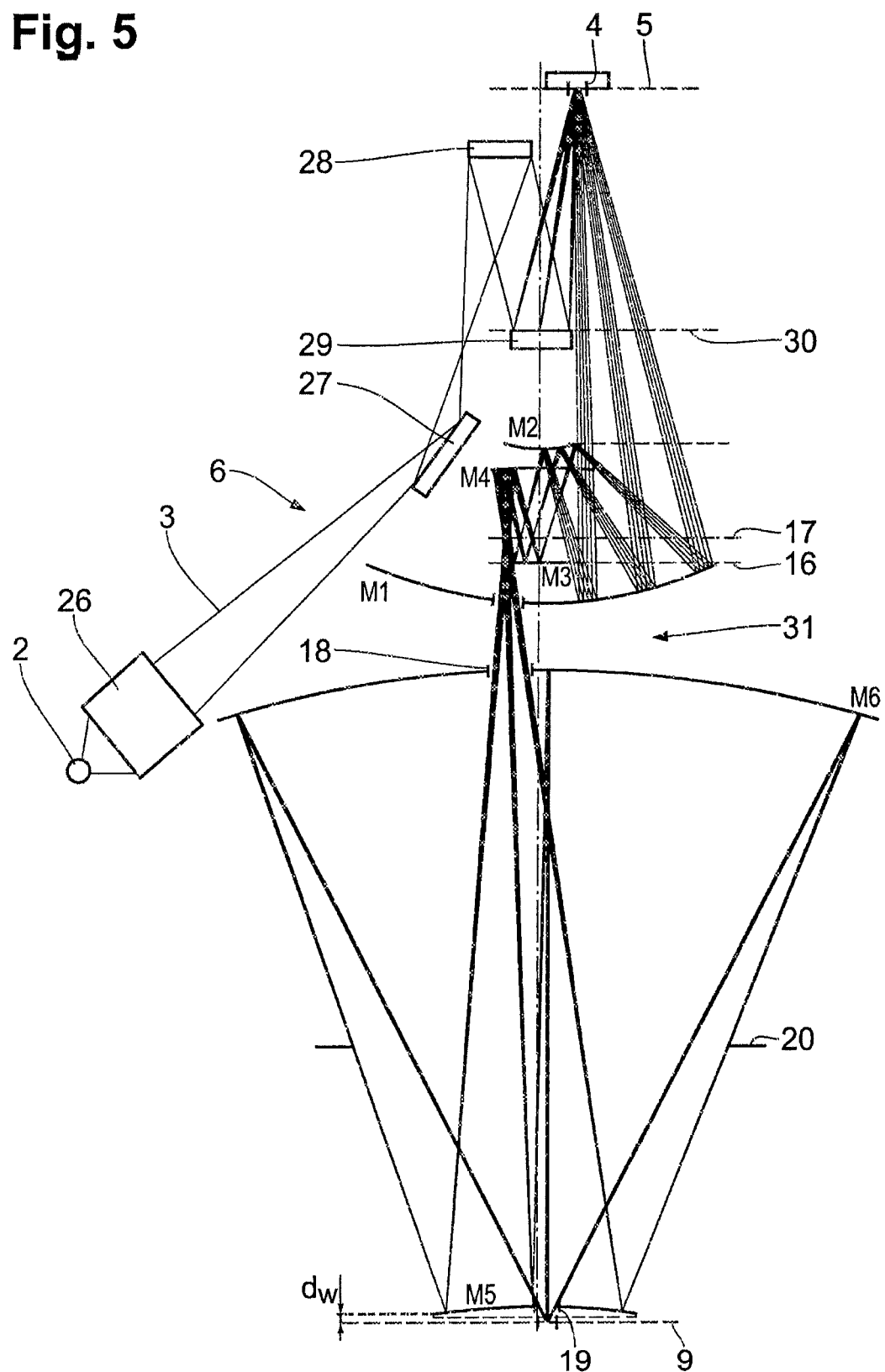
FIG. 5 shows a diagrammatic view of a microlithographic projection exposure apparatus designed for EUV.

FIG. 5 is a diagrammatic view showing a lithographic production exposure apparatus which is designed for operation in the EUV process and in which the disclosure can be implemented.

The projection exposure apparatus of FIG. 5 has an illumination system 6 and a projection objective 31. The illumination system 6 includes in the direction of light propagation of the illumination light 3 emitted by a light source 2, a collector 26, a spectral filter 27, a field facet mirror 28 and a pupil facet mirror 29, from which the light is incident on an object field 4 arranged in an object plane 5. The light from the object field 4 passes into the projection objective 31 with an entrance pupil 30. The projection objective 31 has an intermediate image plane 17, a first pupil plane 16 and a further pupil plane with an aperture member 20 arranged therein.

The projection objective 31 includes in total six mirrors M1-M6, wherein M5 denotes the mirror arranged closest to the wafer or the image plane 9 (in the illustrated embodiment at a spacing $d_w \approx 30$ mm), having a through hole 19. M6 denotes the last mirror in relation to the optical beam path, having a through hole 18. A beam issuing from the object field 4 or reticle arranged in the object plane passes after reflection at the mirrors M1-M6 for producing an image of the structure to be imaged of the reticle, on to a wafer arranged in the image plane 9.

The last mirror M6 in relation to the optical beam path (having the relatively greatest radius) can be of a configuration according to the disclosure for example similar to the embodiment of FIG. 1 or FIG. 2. The mirror M5 closest to the wafer or the image plane 9 can be of a configuration in accordance with the disclosure (in regard to the small structural space available at that position) similarly to the embodiment of FIG. 3 or FIG. 4.

Even if the disclosure has been described by reference to specific embodiments numerous variations and alternative embodiments will be apparent to the man skilled in the art, for example by combination and/or exchange of features of individual embodiments. Accordingly it will be appreciated by the man skilled in the art that such variations and alternative embodiments are also embraced by the disclosure and the scope of the disclosure is limited only in the sense of the accompanying claims and equivalents thereof.

TABLE 1

| Example | Mass [kg] | 1st natural frequency [Hz] | Deformation for 1 g [nm] | Zernike for load situation with radial parasitic moment [nm] | | | | Zernike for load situation with tangential parasitic moment [nm] | | | |
|---|---|---|---|---|---|---|---|---|---|---|---|
| | | | | Z 5 | Z 6 | Z 10 | Z 11 | Z 5 | Z 6 | Z 10 | Z 11 |
| No 1 | 6.32 | 382 | 1114 | 0.24 | 0.14 | 0.02 | 0.00 | 0.24 | 0.14 | 0.02 | 0.00 |
| No 2 | 7.69 | 360 | 496 | 0.00 | 0.06 | 0.00 | 0.02 | 0.01 | 0.02 | 0.01 | 0.01 |

What is claimed is:

1. An optical arrangement, comprising:
an optical element having outer circumference in a plane that extends in a radial direction of the optical element;
a support element in the plane, the support element being outside of the outer circumference of the optical element in the plane; and
at least three decoupling elements connecting the optical element and the support element,
wherein:
the optical element, the support element and the at least three decoupling elements are monolithic;
the optical element has a ratio of a maximum diameter to a maximum thickness of at least 10;
a natural frequency of the optical arrangement is at least 250 Hz; and
the optical arrangement is configured to be used in a microlithographic projection exposure apparatus.

2. The optical arrangement as set forth in claim 1, further comprising mounting elements displaced in a peripheral direction with respect to the decoupling elements, wherein the support element is connectable to a carrier structure of the microlithographic projection exposure apparatus via the mounting elements.

3. The optical arrangement of claim 2, wherein the mounting elements are spaced from each other at a substantially constant distance relative to the decoupling elements in the peripheral direction.

4. The optical arrangement of claim 2, wherein the mounting elements are displaced from each other in a peripheral direction through an angle of 60°±20° relative to the decoupling elements.

5. The optical arrangement of claim 2, wherein the mounting elements are configured to provide a statically defined mounting for the optical element.

6. The arrangement of claim 2, wherein, in the radial direction, the at least three decoupling elements are between the support element and the outer circumference of the optical element.

7. The optical arrangement of claim 1, wherein the decoupling elements are spaced from each other at a substantially constant distance in a peripheral direction.

8. The optical arrangement of claim 1, wherein the decoupling elements are displaced from each other in a peripheral direction through an angle of 120°±30°.

9. The optical arrangement of claim 1, wherein the support element is connected to the optical element via precisely three decoupling elements.

10. The optical arrangement of claim 1, wherein the optical element and the support element comprise a material with a coefficient of thermal expansion of less than 0.5 ppm/K.

11. The optical arrangement of claim 1, wherein the optical element is a mirror.

12. The optical arrangement of claim 1, wherein the support element and/or the optical element has at least one slot configured to cause at least partial decoupling in a radial direction.

13. The optical arrangement of claim 1, wherein the optical element has a central hole.

14. The optical arrangement of claim 1, wherein the optical element has a reinforced edge portion configured to stiffen the optical element.

15. An apparatus, comprising:
an illumination system; and
a projection objective,
wherein the illumination system and/or the projection objective comprise an optical arrangement according to claim 1, and the apparatus is an EUV microlithographic projection exposure apparatus.

16. The arrangement of claim 1, wherein, in the radial direction, the at least three decoupling elements are between the support element and the outer circumference of the optical element.

17. The optical arrangement of claim 1, wherein the natural frequency of the optical arrangement is at least 300 Hz.

18. The optical arrangement of claim 1, wherein the natural frequency of the optical arrangement is at least 600 Hz.

19. The optical arrangement of claim 1, wherein the ratio of the maximum diameter of the optical element to the maximum thickness of the optical element is at least 15.

20. The optical arrangement of claim 1, wherein the ratio of the maximum diameter of the optical element to the maximum thickness of the optical element is at least 20.

21. An apparatus, comprising:
an illumination system; and
a projection objective,
wherein the illumination system and/or the projection objective comprises an optical arrangement, comprising:
a mirror having outer circumference in a plane that extends in a radial direction of the mirror;
a support element in the plane, the support element being outside of the outer circumference of the mirror in the plane; and
at least three decoupling elements that connect the mirror and the support element, and
wherein:
the mirror, the support element and the decoupling elements are monolithic;
the mirror has a ratio of a maximum diameter to a maximum thickness of at least 10; and
the apparatus is an EUV microlithographic projection exposure apparatus.

22. The apparatus of claim 21, wherein the projection objective comprises the optical arrangement, and the mirror is a last mirror in an optical beam path of the projection objective.

23. The apparatus of claim 21, wherein, in the radial direction, the at least three decoupling elements are between the support element and the outer circumference of the mirror.

24. The apparatus of claim 21, wherein the natural frequency of the optical arrangement is at least 300 Hz.

25. The apparatus of claim 21, wherein the natural frequency of the optical arrangement is at least 600 Hz.

26. The apparatus of claim 21, wherein the ratio of the maximum diameter of the mirror to the maximum thickness of the mirror is at least 15.

27. The apparatus of claim 21, wherein the ratio of the maximum diameter of the mirror to the maximum thickness of the mirror is at least 20.

* * * * *

UNITED STATES PATENT AND TRADEMARK OFFICE
CERTIFICATE OF CORRECTION

PATENT NO. : 9,436,101 B2  
APPLICATION NO. : 13/407466  
DATED : September 6, 2016  
INVENTOR(S) : Armin Schoeppach et al.

Page 1 of 1

It is certified that error appears in the above-identified patent and that said Letters Patent is hereby corrected as shown below:

In the Specification

Column 3, Line 59, after the second occurrence of "element", insert -- at --.

Column 5, Lines 46-47, delete "including" and insert -- including: --.

Column 8, Line 36, after "at", insert -- at --.

In the Claims

Column 11, Line 49, Claim 16, before "arrangement", insert -- optical --.

Signed and Sealed this  
Tenth Day of January, 2017

Michelle K. Lee  
*Director of the United States Patent and Trademark Office*